(12) United States Patent
Wang

(10) Patent No.: US 11,949,429 B2
(45) Date of Patent: Apr. 2, 2024

(54) MEMORY DEVICE, ERROR CORRECTION DEVICE AND ERROR CORRECTION METHOD THEREOF

(71) Applicant: MACRONIX International Co., Ltd., Hsinchu (TW)

(72) Inventor: Kuan-Chieh Wang, Taipei (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 17/868,251

(22) Filed: Jul. 19, 2022

(65) Prior Publication Data
US 2024/0030938 A1 Jan. 25, 2024

(51) Int. Cl.
*H03M 13/00* (2006.01)
*G06F 7/501* (2006.01)
*H03M 13/11* (2006.01)
*H03M 13/15* (2006.01)

(52) U.S. Cl.
CPC ......... *H03M 13/1108* (2013.01); *G06F 7/501* (2013.01); *H03M 13/112* (2013.01); *H03M 13/159* (2013.01)

(58) Field of Classification Search
CPC . G06F 7/501; H03M 13/159; H03M 13/1108; H03M 13/118; H03M 13/112
See application file for complete search history.

(56) References Cited

U.S. PATENT DOCUMENTS

| | | | |
|---|---|---|---|
| 8,069,392 B1 | 11/2011 | Norrie | |
| 8,655,169 B2 * | 2/2014 | Perkins | H04J 14/0227 398/100 |
| 10,097,208 B2 * | 10/2018 | Ilani | H03M 13/3746 |
| 10,379,940 B2 * | 8/2019 | Fainzilber | G06F 11/1016 |
| 10,868,566 B2 * | 12/2020 | Yang | H03M 13/3746 |
| 10,979,072 B2 * | 4/2021 | Zamir | H03M 13/1168 |
| 11,016,843 B2 * | 5/2021 | Nakai | H03M 13/45 |

(Continued)

FOREIGN PATENT DOCUMENTS

| | | |
|---|---|---|
| TW | 200419921 | 10/2004 |
| TW | I474329 | 2/2015 |
| TW | I756971 | 3/2022 |

OTHER PUBLICATIONS

"Office Action of Taiwan Counterpart Application", dated Apr. 20, 2023, p. 1-p. 3.

*Primary Examiner* — Esaw T Abraham
(74) *Attorney, Agent, or Firm* — J.C. PATENTS

(57) ABSTRACT

A memory device, an error correction device and an error correction method thereof are provided. The error correction device includes a first error correction decoder and a second error correction decoder. The first error correction decoder performs at least one iteration of a first error correction operation on a data chunk, calculates a counting number of syndrome values equal to a set logic value generated in the at least one iteration of the first error correction operation, and generates a control signal according to the counting number. The second error correction decoder receives the control signal and determines whether to be activated to perform a second error correction operation on the data chunk or not according to the control signal. An error correction ability of the second error correction decoder is higher than an error correction ability of the first error correction decoder.

12 Claims, 8 Drawing Sheets

(56) References Cited

U.S. PATENT DOCUMENTS

| | | | |
|---|---|---|---|
| 11,050,438 B2* | 6/2021 | Kim | H03M 13/616 |
| 11,177,835 B2* | 11/2021 | Cho | G06F 11/1012 |
| 11,184,030 B2* | 11/2021 | Kwak | H03M 13/1168 |
| 11,515,898 B2* | 11/2022 | Jo | H03M 13/1111 |
| 11,611,359 B2* | 3/2023 | Cho | H03M 13/3707 |
| 2012/0140856 A1* | 6/2012 | Yoshikawa | H04N 21/4263 |
| | | | 375/316 |

* cited by examiner

MEMORY DEVICE, ERROR CORRECTION DEVICE AND ERROR CORRECTION METHOD THEREOF

BACKGROUND

Technical Field

The disclosure relates to a memory device, an error correction device and an error correction method thereof, and more particularly, to a memory device, an error correction device and an error correction method thereof capable of adaptively adjusting an error correction algorithm.

Description of Related Art

In order to ensure the correctness of data, it is common to apply the error correction code (ECC) technology. According to the requirement of different number of error bits, the electronic device can set decoders with different algorithms to perform the decoding operation of error correction for data chunks. However, some error correction algorithms can operate with low hardware resources, but have relatively low error correction capabilities. Some algorithms require relatively high hardware resources and have relatively high error correction capabilities. Therefore, how to effectively apply an appropriate error correction algorithm to perform the error correction of the data chunk is an important issue for those skilled in the art.

SUMMARY

The disclosure provides a memory device, an error correction device and an error correction method thereof, which may adaptively switch the error correction algorithm executed to improve the efficiency of the error correction operation.

An error correction device according to the disclosure includes a first error correction decoder and a second error correction decoder. The first error correction decoder performs at least one iteration of a first error correction operation on a data chunk, calculates a counting number of syndrome values equal to a set logic value generated in the at least one iteration of the first error correction operation, and generates a control signal according to the counting number. The second error correction decoder is coupled to the first error correction decoder, receives the control signal and determines whether to be activated to perform a second error correction operation according to the control signal. An error correction ability of the second error correction decoder is higher than an error correction ability of the first error correction decoder.

A memory device according to the disclosure includes a memory cell array and an error correction device. The error correction device is coupled to the memory cell array. The error correction device includes a first error correction decoder and a second error correction decoder. The first error correction decoder performs at least one iteration of a first error correction operation on a data chunk, calculates a counting number of syndrome values equal to a set logic value generated in the at least one iteration of the first error correction operation, and generates a control signal according to the counting number. The second error correction decoder is coupled to the first error correction decoder, receives the control signal and determines whether to be activated to perform a second error correction operation according to the control signal. An error correction ability of the second error correction decoder is higher than an error correction ability of the first error correction decoder.

An error correction method according to the disclosure includes: performing at least one iteration of a first error correction operation on a data chunk; calculating a counting number of syndrome values equal to a set logic value generated in the at least one iteration of the first error correction operation, and generating a control signal according to the counting number; and determining whether to be activated to perform a second error correction operation according to the control signal, and an error correction ability of the second error correction operation is higher than an error correction ability of the first error correction operation.

Based on the above, the error correction device related to the error correction code (ECC) of the disclosure may first perform at least one iteration of the first error correction operation on a data chunk, and determine whether to activate a second error correction operation with a relatively high error correction ability according to the state of the syndrome values generated in the at least one iteration of the first error correction operation. In this way, the error correction operation of the disclosure may be adaptively adjusted, and the data chunk error correction operation may be performed more efficiently.

DESCRIPTION OF EMBODIMENTS

Figure 1:
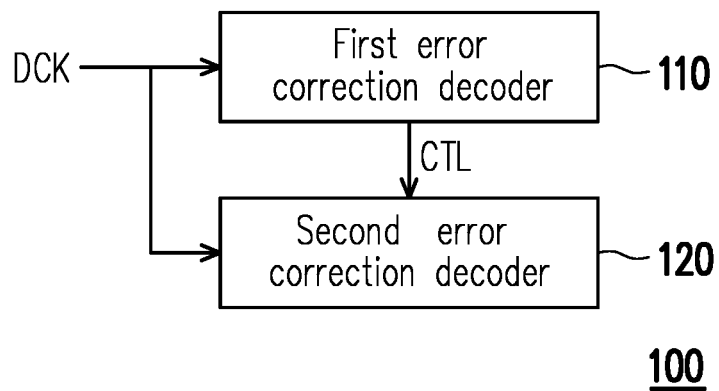
FIG. 1 is a schematic diagram of an error correction device according to an embodiment of the disclosure.

Please refer to FIG. 1. FIG. 1 is a schematic diagram of an error correction device according to an embodiment of the disclosure. The error correction device 100 is used for performing an error correction operation of error correction code (ECC). An error correction device 100 includes a first error correction decoder 110 and a second error correction decoder 120. The first error correction decoder 110 may perform a first error correction operation according to a first error correction algorithm. The second error correction decoder 120 may perform a second error correction operation according to a second error correction algorithm different from the first error correction algorithm. In this embodiment, the first error correction decoder 110 that executes the first error correction algorithm may have a relatively simple hardware structure and perform the first error correction operation under the condition of relatively low hardware requirements and power consumption. The second error correction decoder 120 that executes the second error correction algorithm may have a relatively high error correction ability and may perform a correction operation on relatively more error bits, wherein the correction ability is a correctable bit number generated by executing the second error correction algorithm. Of course, the second error correction decoder 120 may have a relatively complex hardware structure and requires relatively large power consumption.

In this embodiment, the first error correction decoder 110 performs the first error correction operation according to a bit-flipping algorithm (BFA), for example; and the second error correction decoder 120 performs the second error correction operation according to a minimum-sum algorithm (MSA), for example.

Figure 2:
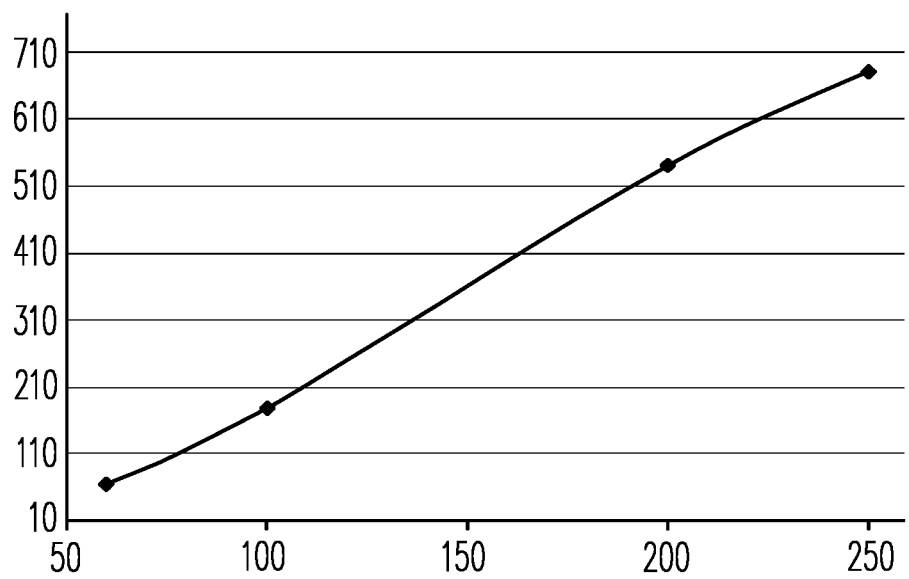
FIG. 2 is a diagram showing the relationship between the number of error bits and the state of the syndrome value of the bit-flipping algorithm according to an embodiment of the disclosure.

Here, please refer to FIG. 2 first. FIG. 2 is a diagram showing the relationship between the number of error bits and the state of the syndrome value of the bit-flipping algorithm according to an embodiment of the disclosure. FIG. 2 takes a 4K byte low-density parity-check code (LDPC code) as an example, in which a horizontal axis is number of error bits in each data chunk in a first iteration of applying the bit-flipping algorithm, and a vertical axis is average number of the corresponding syndrome values with logic value 1. It may be clearly seen here that the number of error bits in the data chunk is almost proportional to the number of syndrome values with logic value 1 in the first iteration of the bit-flipping algorithm. Therefore, through the first iteration of the bit-flipping algorithm, by counting the number of the syndrome values with the logic value 1, the number of error bits in the data chunk may be predicted.

Please refer to FIG. 1 again. The first error correction decoder 110 may perform at least one iteration of the first error correction operation for a data chunk DCK, and calculate a counting number of the syndrome values equal to a set logic value generated in the at least one iteration of the first error correction operation. In an embodiment of the disclosure, the above-mentioned set logic value may be logic value 1, and based on the conclusion obtained from FIG. 2, the counting number of the syndrome values equal to logic value 1 may correspond to the number of error bits in the data chunk DCK. Therefore, the first error correction decoder 110 may generate a control signal CTL according to the counting number of the syndrome values equal to the logic value 1.

Further from the above embodiment, in detail, the first error correction decoder 110 may compare the counting number of the syndrome values equal to the logic value 1 with a preset reference threshold, and generate the control signal CTL according to comparison result. Specifically, when the counting number of the syndrome values equal to logic value 1 is higher than the reference threshold, it indicates that the number of error bits of the data chunk DCK may be too large, and it is not suitable for applying the first error correction decoder 110 to perform error correction operations. Therefore, the first error correction decoder 110 may generate the control signal CTL according to the comparison result that the counting number is higher than the reference threshold, and the second error correction decoder 120 may be activated according to the control signal CTL and replace the first error correction decoder 110 to perform error correction operations on the data block DCK. The second error correction decoder 120 may determine a correction capability when activated according to the control signal CTL.

On the contrary, when the counting number of the syndrome values equal to the logic value 1 is not higher than the reference threshold, it indicates that the number of error bits of the data chunk DCK is relatively low. In such a case, the first error correction decoder 110 may generate the control signal CTL according to the comparison result that the counting number is not higher than the reference threshold, and the second error correction decoder 120 is not activated. In such a case, the first error correction decoder 110 may continue to perform subsequent iterations of error correction operations on the data chunk DCK and complete the error correction operations on the data chunk DCK.

In another embodiment of the disclosure, the set logic value may be a logic value 0. According to FIG. 2, it may be determined that the counting number of the syndrome values equal to the logic value 0 may be negatively correlated with the number of error bits of the data chunk DCK. Therefore, the first error correction decoder 110 may compare the counting number of the syndrome values equal to the logic value 0 with another reference threshold, and generate the control signal CTL according to the comparison result. Specifically, when the counting number of the syndrome values equal to logic value 0 is less than the reference threshold, it indicates that the number of error bits of the data chunk DCK may be too large, and it is not suitable for applying the first error correction decoder 110 to perform error correction operations. Therefore, the first error correction decoder 110 may generate the control signal CTL according to the comparison result that the counting number is less than the reference threshold, and the second error correction decoder 120 may be activated according to the control signal CTL and replace the first error correction decoder 110 to perform error correction operations on the data block DCK.

On the contrary, when the counting number of the syndrome values equal to the logic value 0 is not less than the reference threshold, it indicates that the number of error bits of the data chunk DCK is relatively low. In such a case, the first error correction decoder 110 may generate the control signal CTL according to the comparison result that the counting number is not higher than the reference threshold, and the second error correction decoder 120 is not activated. In such a case, the first error correction decoder 110 may continue to perform subsequent iterations of error correction operations on the data chunk DCK and complete the error correction operations on the data chunk DCK.

It may be known from the above description that the error correction device 100 according to the embodiment of the disclosure performs an iteration of the first error correction operation through the first error correction decoder 110, and pre-determines the state of the number of error bits of the data chunk DCK according to the state of the syndrome values to select one of the first error correction decoder 110 and the second error correction decoder 120 to perform error correction operations on the data chunk DCK. In this way, the error correction device 100 according to the embodiment of the disclosure may adaptively adjust the error correction algorithm executed, thereby effectively improving the performance of the error correction operation.

Figure 3A:
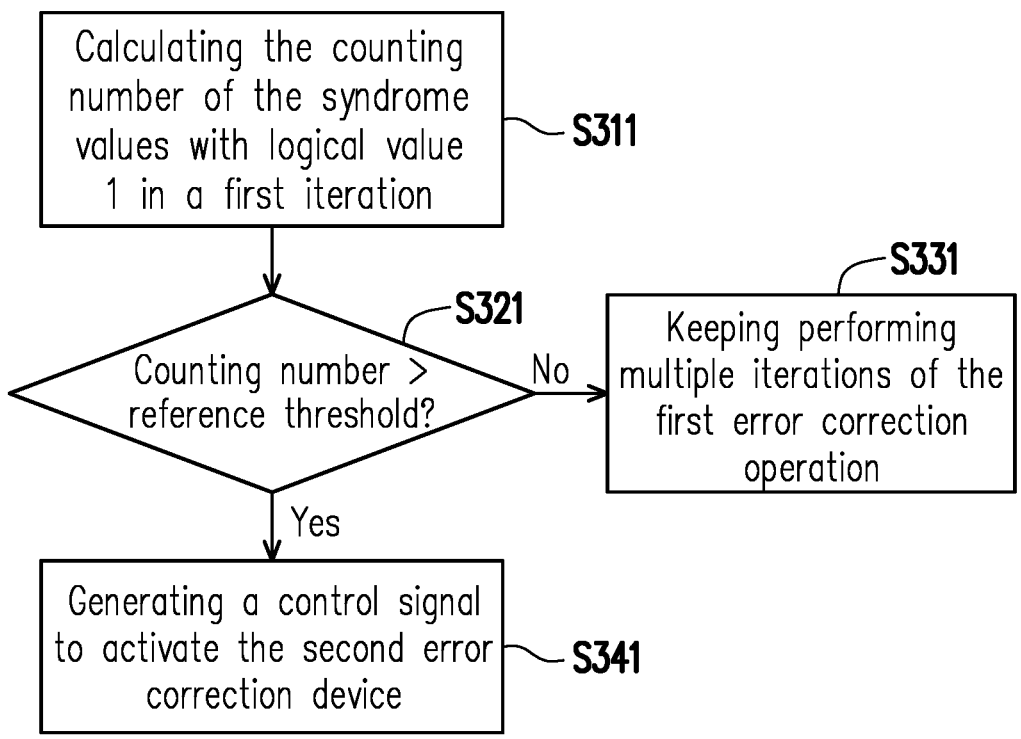
FIG. 3A and FIG. 3B are flowcharts of implementations of different error correction methods performed by the error correction device according to embodiments of the disclosure, respectively.
Figure 3B:
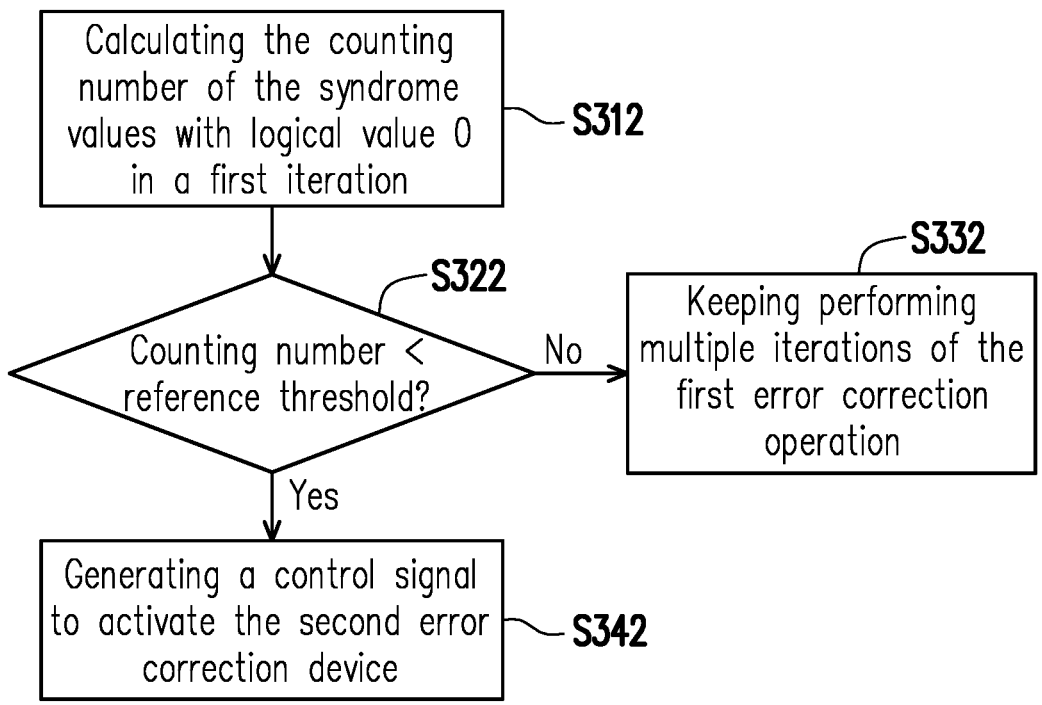

Hereinafter, please refer to FIG. 3A and FIG. 3B. FIG. 3A and FIG. 3B are flowcharts of implementations of different error correction methods performed by the error correction device according to embodiments of the disclosure, respectively. In FIG. 3A, in step S311, the first error correction decoder may calculate the counting number of the syndrome values with logic value 1 in the performed first iteration of the first error correction operation. Further, in step S321, when the counting number is higher than the reference threshold, the first error correction decoder may generate a control signal to activate the second error correction decoder, and the second error correction decoder takes over the error correction operation of the data chunk. When the counting number is not higher than the reference threshold, in step S331, the first error correction decoder keeps performing multiple iterations of the first error correction operation.

In FIG. 3B, in step S312, the first error correction decoder may calculate the counting number of the syndrome values with logic value 0 in the performed first iteration of the first error correction operation. Further, in step S322, when the counting number is less than the reference threshold, the first error correction decoder may generate a control signal to activate the second error correction decoder, and the second error correction decoder takes over the error correction operation of the data chunk. When the counting number is not less than the reference threshold, in step S332, the first error correction decoder keeps performing multiple iterations of the first error correction operation.

In addition, the reference thresholds in FIG. 3A and FIG. 3B may be different.

Figure 4:
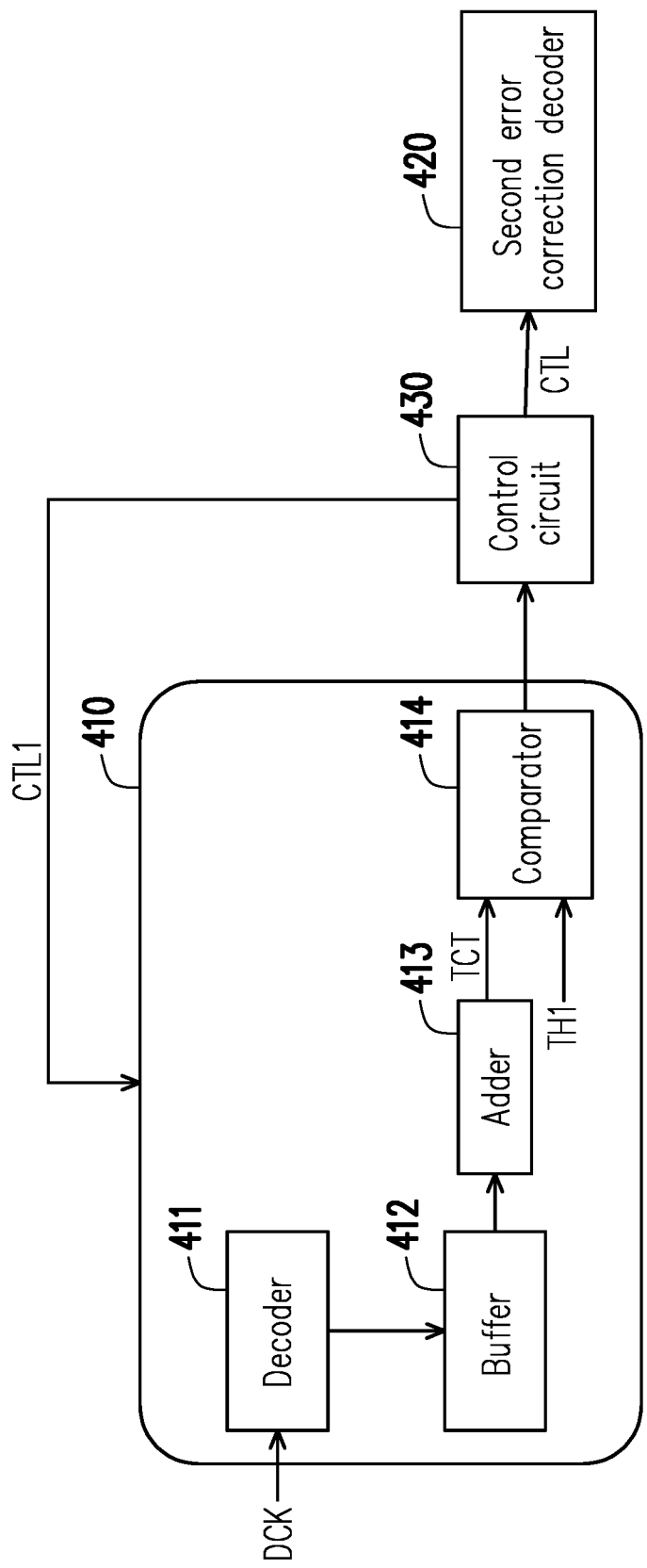
FIG. 4 is a schematic diagram of an error correction device according to another embodiment of the disclosure.

Hereinafter, please refer to FIG. 4. FIG. 4 is a schematic diagram of an error correction device according to another embodiment of the disclosure. An error correction device 400 includes a first error correction decoder 410, a second error correction decoder 420 and a control circuit 430. The first error correction decoder 410 is coupled to the second error correction decoder 420. The first error correction decoder 410 includes a decoder 411, a buffer 412, an adder 413 and a comparator 414. The decoder 411 may receive the data chunk DCK and perform error correction operations on the data chunk DCK according to an error correction algorithm, such as a bit-flipping algorithm (BFA). The buffer 412 is used to store the syndrome values generated when the decoder 411 performs the first iteration of the error correction operation. The adder 413 is coupled to the buffer 412 and is used to calculate the sum of all syndrome values stored in the buffer 412. In this embodiment, the adder 413 may obtain a counting number TCT of the syndrome values equal to the logic value 1 by calculating the sum of the syndrome values.

The comparator 414 is coupled to the adder 413, and is used to compare the counting number TCT generated by the adder 413 with a preset reference threshold TH1, and generate a comparison result. In the comparator 414, a logic circuit may be built in to perform an OR operation on the comparison result with an original fail flag and an original complete flag in the first error correction decoder 410. The original fail flag is used to indicate that the decoding result of the first error correction decoder 410 is failed, and the original complete flag is used to indicate that the decoding operation of the first error correction decoder 410 has been completed.

The comparator 414 transmits the operation result generated by the built-in logic circuit to the control circuit 430. The control circuit 430 may generate the control signal CTL according to the operation result generated by the logic circuit. Specifically, when the comparison result generated by the comparator 414 is a logic value 1, the control circuit 430 may provide the control signal CTL with logic value 1 to activate the second error correction decoder 420.

The second error correction decoder 420 receives the control signal CTL, and determines whether to be activated according to the control signal CTL. In this embodiment, when the counting number TCT is higher than the reference threshold TH1, the second error correction decoder 420 may be activated according to the control signal CTL; conversely, when the counting number TCT is not higher than the reference threshold TH1, the second error correction decoder 420 may not be activated according to the control signal CTL.

In this embodiment, the adder 413 may also be a counter, and is used to count the number of syndrome values with logic value 1. Both the comparator 414 and the adder 413 may be digital circuits, and may be implemented by using related circuits known to those skilled in the art, without any specific limitations.

In another embodiment of the disclosure, the adder 413 may be used to count the number of syndrome values with logic value 0. Here, the adder 413 may add 1's complement of all the syndrome values to obtain the number of the syndrome values with logic value 0, and obtain the counting number TCT. Of course, in such an embodiment, similarly, the adder 413 may be a counter, and is used to count the number of syndrome values with logic value 0 to obtain the counting number TCT. Here, the comparator 414 may compare the counting number TCT with another reference threshold (for example, a second reference threshold), and generate the control signal CTL to activate the second error correction decoder 420 when the counting number TCT is less than the second reference threshold, and generate the control signal CTL so that the second error correction decoder 420 is not activated when the counting number TCT is not less than the second reference threshold.

In addition, the control circuit 430 may provide another control signal CTL1 to the first error correction decoder 410 to activate the first error correction decoder 410. In this case, when the second error correction decoder 420 is activated to perform the error correction operation on the data chunk DCK according to the control signal CTL, the first error correction decoder 410 may be simultaneously activated to perform the error correction operation on another data chunk.

Incidentally, the error correction device 400 of this embodiment may be disposed in a memory device, and performs error correction operations on the data read out from the memory device.

Figure 5:
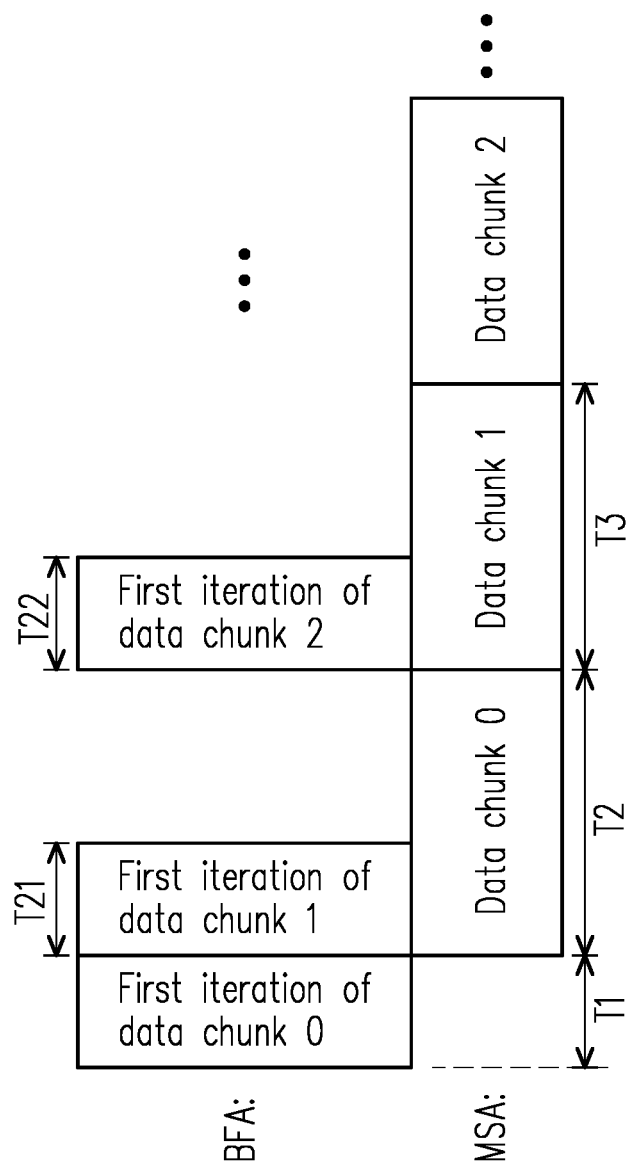
FIG. 5 is an operation sequence diagram of an error correction device according to an embodiment of the disclosure.

Hereinafter, please refer to FIG. 5. FIG. 5 is an operation sequence diagram of an error correction device according to an embodiment of the disclosure. The first error correction decoder of the error correction device executes the bit-flipping algorithm BFA, and the second error correction decoder executes the minimum-sum algorithm MSA. In the time interval T1, the first error correction decoder may perform the first iteration of the bit-flipping algorithm BFA for a data chunk 0. By analyzing the number of syndrome values with logic value 1, the second error correction decoder may be activated to perform the minimum-sum algorithm MSA on the data chunk 0 during the time interval T2. During the sub-time interval T21 in the time interval T2, the first error correction decoder may synchronously execute the bit-flipping algorithm BFA on a data chunk 1.

Next, in the time interval T3, the second error correction decoder may be activated to perform the minimum-sum algorithm MSA on the data chunk 1. During the sub-time interval T31 in the time interval T3, the first error correction decoder may synchronously execute the bit-flipping algorithm BFA on a data chunk 2.

In this embodiment, the first error correction decoder and the second error correction decoder of the error correction device may perform operations synchronously, thereby effectively improving the efficiency of the error correction operations.

In the above sequence diagram, when the number of the syndrome values with logic value 1 generated in the first iteration of the error correction operation (for example, in the time interval T1) is not higher than the reference threshold, the error correction operation by the bit-flipping algorithm BFA on the data chunk may be continuously performed, and it is not necessary to activate and apply the minimum-sum algorithm MSA in the time interval T2 to perform the error correction operation.

Figure 6:
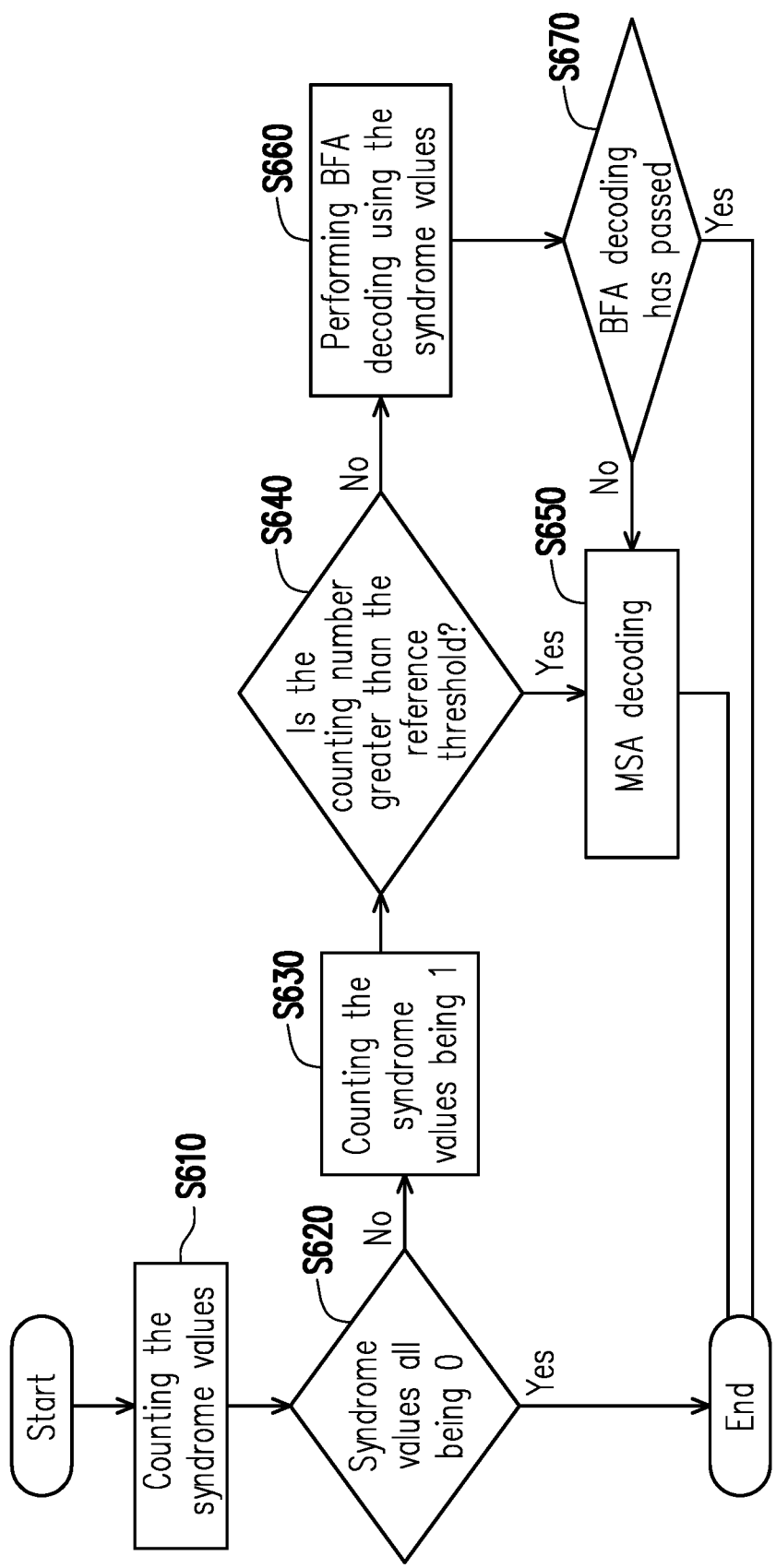
FIG. 6 is a flowchart showing an error correction operation according to another embodiment of the disclosure.

Hereinafter, please refer to FIG. 6. FIG. 6 is a flowchart showing an error correction operation according to another embodiment of the disclosure. In step S610, the error correction device may perform the first iteration of the error correction operation through the first error correction decoder, and count the syndrome values. The first error correction decoder may first determine whether the syndrome values are all logic values 0 (step S620), and when the syndrome values are all logic values 0, it indicates that the error correction operation on the data chunk has been completed, and this process may be ended. When not all the syndrome values are logic values 0, step S630 may be performed to calculate the counting number of the syndrome values with logic value 1.

Next, in step S640, it is determined whether the counting number is higher than the reference threshold. When the counting number is higher than the reference threshold, step S650 may be performed to activate the decoding mechanism of the minimum-sum algorithm MSA. When the counting number is not higher than the reference threshold, step S660 may be performed, and the subsequent operations of the decoding mechanism of the bit-flipping algorithm BFA are performed using the obtained syndrome values.

In step S670, when the decoding mechanism of the bit-flipping algorithm BFA has reached the maximum number of iterations, it may be determined whether the decoding mechanism of the bit-flipping algorithm BFA has completed the error correction of the data chunk (passed), and if the determination result is affirmative, this process may be ended. On the contrary, if the determination result of step S670 is negative, similarly, step S650 may be executed to activate the decoding mechanism of the minimum-sum algorithm MSA to complete the error correction of the data chunk.

Figure 7:
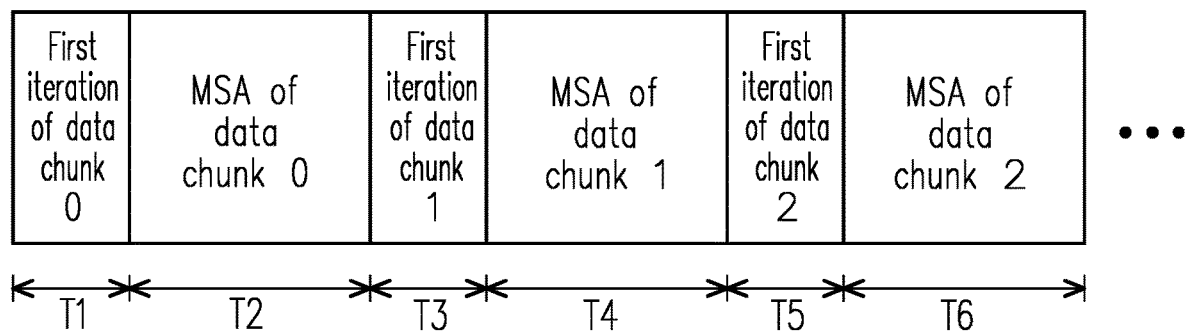
FIG. 7 is an operation sequence diagram of an error correction device according to another embodiment of the disclosure.

Please refer to FIG. 7. FIG. 7 is an operation sequence diagram of an error correction device according to another embodiment of the disclosure. In FIG. 7, in the time interval T1, the bit-flipping algorithm BFA may be applied to perform the first iteration of the error correction operation on the data chunk 0. Then, based on the number of the syndrome values with logic value 1 generated in the first iteration of the error correction operation being higher than the reference threshold, the minimum-sum algorithm MSA may be activated to perform the error correction operation on the data chunk 0 in the time interval T2. Next, in the time interval T3, the bit-flipping algorithm BFA may be applied to perform the first iteration of the error correction operation on the data chunk 1. Then, based on the number of the syndrome values with logic value 1 generated in the first iteration of the error correction operation being higher than the reference threshold, the minimum-sum algorithm MSA may be activated to perform the error correction operation on the data chunk 1 in the time interval T4. Similarly, in the time interval T5, the bit-flipping algorithm BFA may be applied to perform the first iteration of the error correction operation on the data chunk 2. Then, based on the number of the syndrome values with logic value 1 generated in the first iteration of the error correction operation being higher than the reference threshold, the minimum-sum algorithm MSA may be activated to perform the error correction operation on the data chunk 2 in the time interval T6.

In the above sequence diagram, when the number of the syndrome values with logic value 1 generated in the first iteration of the error correction operation (for example, in the time interval T1) is not higher than the reference threshold, the error correction operation by the bit-flipping algorithm BFA on the data chunk may be continuously performed, and it is not necessary to activate and apply the minimum-sum algorithm MSA in the time interval T2 to perform the error correction operation.

In this embodiment, the bit-flipping algorithm BFA and the minimum-sum algorithm MSA are not performed at the same time; therefore, the first error correction decoder and the second error correction decoder in this embodiment may be share the same circuit for implementation. The circuit structure of the error correction decoder may be implemented by applying the first error correction decoder 410 of FIG. 4. The first error correction decoder 410 is caused to execute the bit-flipping algorithm BFA or the minimum-sum algorithm MSA according to the control signal CTL.

Figure 8:
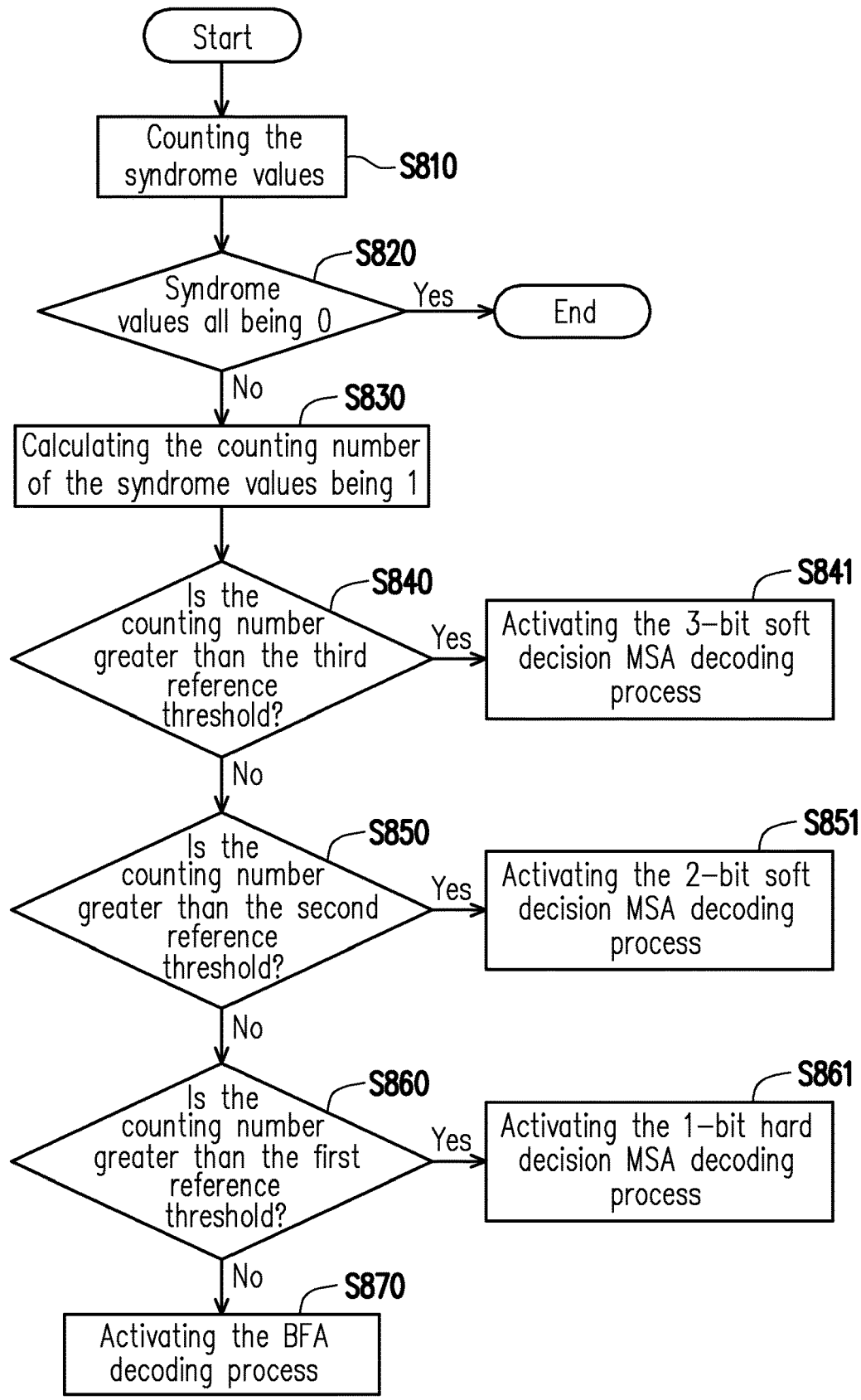
FIG. 8 is a flowchart showing an error correction operation according to another embodiment of the disclosure.

Hereinafter, please refer to FIG. 8. FIG. 8 is a flowchart showing an error correction operation according to another embodiment of the disclosure. In step S810, the error correction device may calculate the syndrome values generated in the first iteration of the bit-flipping algorithm, and in step S820, determine whether the syndrome values are all 0. If all the syndrome values are 0, it indicates that the error correction has been completed, and the process may be ended. If the determination result in step S820 is negative, then in step S830, the counting number of the syndrome values equal to 1 is calculated. Next, in step S840, the error correction device may determine whether the counting number is higher than the third reference threshold, and if the determination result is affirmative, it may perform step S841 to activate the decoding process of a 3-bit soft decision minimum-sum algorithm MSA (the 3-bit soft decision, a 2-bit soft decision and a 1-bit hard decision represent the reliability range for every input bit of decoder, not exact error correction ability. For a 4 KB data chunk example, the 1-bit hard decision has 250-bit error correction ability, the 2-bit soft decision has 450-bit error correction ability, the 3-bit soft decision has 550-bit error correction ability). On the other hand, if in step S840, the error correction device determines that the counting number is not higher than the third reference threshold, it performs step S850.

Next, in step S850, the error correction device may determine whether the counting number is higher than the second reference threshold, and if the determination result is affirmative, it may perform step S851 to activate the decoding process of the 2-bit soft decision minimum-sum algorithm MSA. On the other hand, if in step S850, the error correction device determines that the counting number is not higher than the second reference threshold, it performs step S860.

Next, in step S860, the error correction device may determine whether the counting number is higher than the first reference threshold, and if the determination result is affirmative, it may perform step S861 to activate the decoding process of the 1-bit hard decision minimum-sum algorithm MSA. On the other hand, if in step S860, the error correction device determines that the counting number is not higher than the first reference threshold, it performs step S870 to activate the decoding process of the bit-flipping algorithm BFA.

In this embodiment, the third reference threshold is higher than the second reference threshold, and the second reference threshold is higher than the first reference threshold. Steps S840 to 860 are used to determine within which of multiple ranges defined by multiple reference thresholds the counting number of the syndrome values equal to 1 falls. The error correction device may determine the level of error correction bits of the activated minimum-sum algorithm MSA according to the range in which the counting number falls, or continuously apply the bit-flipping algorithm BFA to perform error correction operations.

Figure 9:
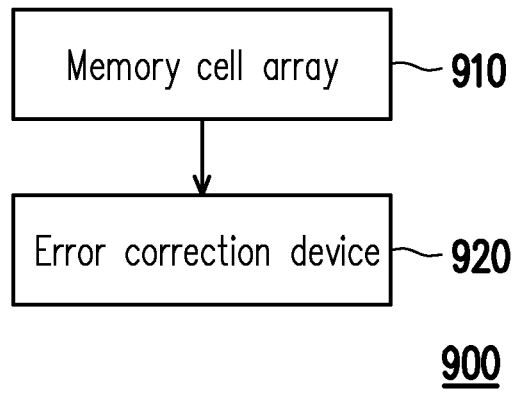
FIG. 9 is a schematic diagram of a memory device according to an embodiment of the disclosure.

Hereinafter, please refer to FIG. 9. FIG. 9 is a schematic diagram of a memory device according to an embodiment of the disclosure. The memory device 900 includes a memory cell array 910 and an error correction device 920. The error correction device 920 is coupled to the memory cell array 910 and is used for performing error correction operations on the data chunks read by the memory cell array 910. The implementation details of the error correction device 920 have been described in detail in the foregoing embodiments and implementations, and will not be repeated here.

In this embodiment, the memory cell array may be any type of memory cell array, such as a resistive memory cell array, AND, NAND, or NOR flash memory cell arrays, and any memory cell array known to those skilled in the art, all of which may be applied to the disclosure.

Figure 10:
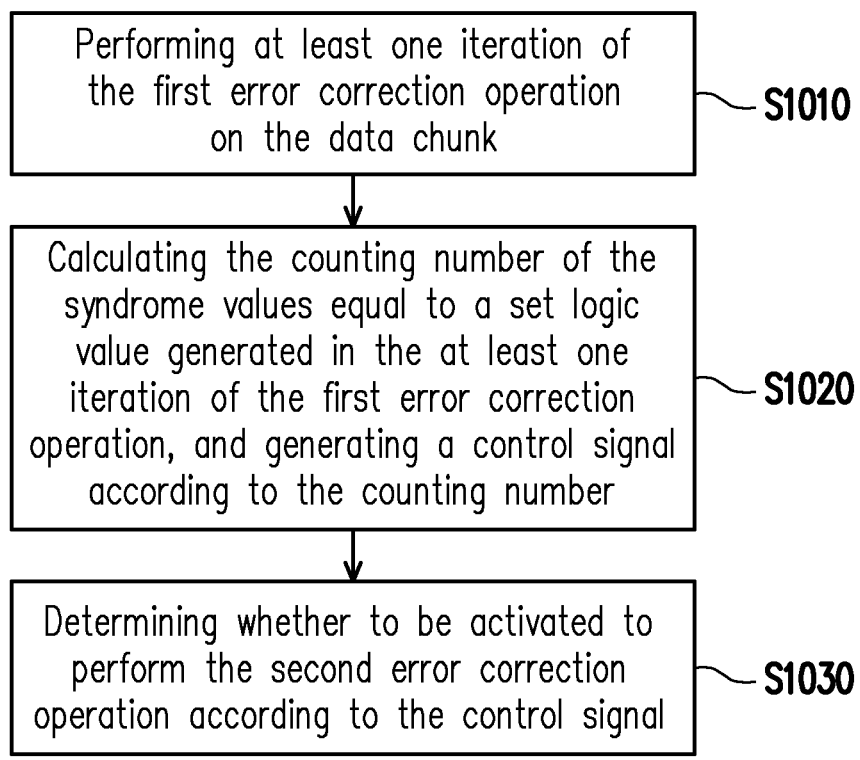
FIG. 10 is a flowchart showing an error correction method according to an embodiment of the disclosure.

Hereinafter, please refer to FIG. 10. FIG. 10 is a flowchart showing an error correction method according to an embodiment of the disclosure. In step S1010, the error correction device may perform at least one iteration of the first error correction operation on the data chunk. In addition, in step S1020, the error correction device may calculate the counting number of the syndrome values equal to a set logic value generated in the at least one iteration of the first error correction operation, and generate a control signal according to the counting number. Next, in step S1030, the error correction device may determine whether to be activated to perform the second error correction operation according to the control signal.

The implementation details of the above steps have been described in detail in the foregoing embodiments and implementations, and will not be repeated here.

To sum up, the error correction device of the disclosure performs an iteration of the first error correction operation on the data chunk through the first error correction decoder, and analyzes the logic value state of the syndrome values generated at this time to determine whether to activate the second error correction decoder with relatively high error correction ability. In this way, the error correction device of the disclosure may adaptively activate the first error correction decoder or the second error correction decoder to perform error correction operations on data chunks, which may effectively improve the performance of error correction operations.

What is claimed is:

1. An error correction device, comprising:
  a first error correction decoder, performing at least one iteration of a first error correction operation on a data chunk, calculating a counting number of syndrome values equal to a set logic value generated in the at least one iteration of the first error correction operation, and generating a control signal according to the counting number; and
  a second error correction decoder, coupled to the first error correction decoder, receiving the control signal and determining whether to be activated to perform a second error correction operation or not according to the control signal,
  wherein an error correction ability of the second error correction decoder is higher than an error correction ability of the first error correction decoder,
  wherein the first error correction decoder is used to compare the counting number with a plurality of different reference thresholds, wherein the reference thresholds form a plurality of ranges, the first error correction decoder determines within which of the ranges the counting number falls to generate the control signal, and the second error correction decoder determines whether to be activated and determines a correction capability when activated according to the control signal.

2. The error correction device according to claim 1, wherein the first error correction decoder performs the first error correction operation according to a bit-flipping algorithm, and the second error correction decoder performs the second error correction operation according to a minimum-sum algorithm.

3. The error correction device according to claim 1, wherein the first error correction decoder comprises:
  a decoder for decoding the data chunk;
  a buffer coupled to the decoder for storing the syndrome values;
  an adder coupled to the buffer for calculating the counting number;
  a comparator coupled to the adder for generating a comparison result by comparing the counting number with at least one reference threshold; and
  a control circuit coupled to the comparator for generating the control signal according to the comparison result.

4. The error correction device according to claim 1, wherein when the second error correction decoder is activated to perform the second error correction operation on a first data chunk, the first error correction decoder synchronously performs the first error correction operation on a second data chunk.

5. The error correction device according to claim 1, wherein after the second error correction decoder is activated and completes performing the second error correction operation on a first data chunk, the first error correction decoder performs the first error correction operation on a second data chunk.

6. A memory device comprising:
  a memory cell array; and
  an error correction device coupled to the memory cell array, wherein the error correction device comprises:
  a first error correction decoder that performs at least one iteration of a first error correction operation on a data chunk, calculates a counting number of syndrome values equal to a set logic value generated in the at least one iteration of the first error correction operation, and generates a control signal according to the counting number; and
  a second error correction decoder that is coupled to the first error correction decoder, receives the control signal and determines whether to be activated to perform a second error correction operation according to the control signal, wherein an error correction ability of the second error correction decoder is higher than an error correction ability of the first error correction decoder, wherein the first error correction decoder is used to compare the counting number with a plurality of different reference thresholds, wherein the reference thresholds form a plurality of ranges, the first error correction decoder determines within which of the ranges the counting number falls to generate the control signal, and the second error correction decoder determines whether to be activated and determines a correction capability when activated according to the control signal.

7. The memory device according to claim 6, wherein the first error correction decoder performs the first error correction operation according to a bit-flipping algorithm, and the second error correction decoder performs the second error correction operation according to a minimum-sum algorithm.

8. The memory device according to claim 6, wherein the first error correction decoder and the second error correction decoder may be activated synchronously to process different data chunks, respectively.

9. The memory device according to claim 6, wherein after the second error correction decoder is activated and completes performing the second error correction operation on a first data chunk, the first error correction decoder performs the first error correction operation on a second data chunk.

10. An error correction method comprising:
    performing at least one iteration of a first error correction operation on a data chunk;
    calculating a counting number of syndrome values equal to a set logic value generated in the at least one iteration of the first error correction operation, and generating a control signal according to the counting number; and
    determining whether to be activated to perform a second error correction operation according to the control signal,
    wherein an error correction ability of the second error correction operation is higher than an error correction ability of the first error correction operation,
    wherein generating the control signal according to the counting number and determining whether to be activated to perform a second error correction operation according to the control signal comprises:
    comparing the counting number with a plurality of different reference thresholds, wherein the reference thresholds form a plurality of ranges;
    determining within which of the ranges the counting number falls to generate the control signal;
    determining whether to activate the second error correction operation and determining a correction capability when the second error correction operation is activated according to the control signal.

11. The error correction method according to claim 10, wherein generating the control signal according to the counting number comprises:
    generating the control signal by comparing the counting number with a reference threshold.

12. The error correction method according to claim 10, wherein the first error correction operation is performed according to a bit-flipping algorithm, and the second error correction operation is performed according to a minimum-sum algorithm.

* * * * *